United States Patent
Hirose et al.

(10) Patent No.: US 10,120,015 B2
(45) Date of Patent: Nov. 6, 2018

(54) METHOD FOR INSPECTING INSULATOR FOR SPARK PLUG

(71) Applicant: NGK SPARK PLUG CO., LTD., Nagoya-shi, Aichi (JP)

(72) Inventors: Kazumichi Hirose, Kasugai (JP); Yoshiaki Hashiguchi, Kani (JP); Shou Nakama, Komaki (JP)

(73) Assignee: NGK SPARK PLUG CO., LTD., Aichi (JP)

(*) Notice: Subject to any disclaimer, the term of this patent is extended or adjusted under 35 U.S.C. 154(b) by 15 days.

(21) Appl. No.: 15/008,740

(22) Filed: Jan. 28, 2016

(65) Prior Publication Data

US 2016/0223604 A1    Aug. 4, 2016

(30) Foreign Application Priority Data

Jan. 30, 2015  (JP) ................................. 2015-017906
Nov. 19, 2015  (JP) ................................. 2015-226312

(51) Int. Cl.
*G01R 31/12* (2006.01)
*H01T 13/60* (2011.01)

(52) U.S. Cl.
CPC ......... *G01R 31/1263* (2013.01); *H01T 13/60* (2013.01)

(58) Field of Classification Search
CPC .................................................... H01T 13/58
See application file for complete search history.

(56) References Cited

U.S. PATENT DOCUMENTS

| 2,603,685 | A | * | 7/1952 | Bychinsky | ............. H01T 13/58 315/177 |
| 2008/0136305 | A1 | * | 6/2008 | Kadowaki | ............. H01T 13/20 313/141 |
| 2008/0315895 | A1 | | 12/2008 | Honda et al. | |
| 2009/0224767 | A1 | * | 9/2009 | Honda | ................... H01T 13/58 324/400 |
| 2013/0337717 | A1 | | 12/2013 | Hirose et al. | |

FOREIGN PATENT DOCUMENTS

| EP | 2 006 699 A2 | 12/2008 |
| JP | 2007-134132 A | 5/2007 |
| JP | 2009-2820 A | 1/2009 |
| JP | 2012-185963 A | 9/2012 |
| JP | 2013-89428 A | 5/2013 |

OTHER PUBLICATIONS

Communication dated Jun. 22, 2016 issued by the European Patent Office in counterpart European Patent Application No. 16153421.9.
Office Action dated Jan. 17, 2017 issued by the Japanese Patent Office in counterpart Japanese Patent Application No. 2015-226312.

* cited by examiner

*Primary Examiner* — Noam Reisner
(74) *Attorney, Agent, or Firm* — Sughrue Mion, PLLC (57) ABSTRACT

A method for inspecting an insulator for a spark plug to determine whether or not the insulator has a defect, the spark plug extending in an axial direction, includes a voltage applying step of applying a voltage between a first electrode disposed in an axial hole in the insulator and a second electrode disposed near an outer peripheral surface of the insulator. The voltage applying step is performed while a gap between a front end of the first electrode and an inner peripheral surface of the insulator that faces the front end of the first electrode in a radial direction is filled with a first insulating material without leaving a hollow space.

5 Claims, 5 Drawing Sheets

METHOD FOR INSPECTING INSULATOR FOR SPARK PLUG

BACKGROUND OF THE INVENTION

1. Field of the Invention

The present invention relates to a method for inspecting an insulator for a spark plug used to cause an ignition in, for example, an internal combustion engine.

2. Description of the Related Art

PTL 1 discloses a method for inspecting an insulator for a spark plug. This inspection method includes a first step of applying a predetermined voltage between an electrode disposed in an axial hole of the insulator and an electrode disposed near the outer peripheral surface of the insulator. In the first step, penetration occurs at a portion of the insulator including a defect due to the applied voltage, so that the defect becomes apparent. After the first step, a second step of applying a voltage lower than the voltage applied in the first step between the two electrodes is performed. In the second step, a spark discharge that occurs at the portion including the defect that has become apparent is detected, so that the defect in the insulator is detected.

CITATION LIST

Patent Literature

PTL 1: Japanese Unexamined Patent Application Publication No. 2007-134132

In the above-described technology, a voltage higher than or equal to a voltage at which flashover occurs cannot be applied in the first step. The flashover is a phenomenon in which a spark discharge occurs along a path that extends along the surfaces (inner and outer peripheral surfaces) of the insulator without penetrating the insulator. Therefore, even when the insulator has a defect, penetration may not occur at the portion including the defect in the first step if the defect is relatively small. As a result, there is a risk that a defect of the insulator cannot be detected. Accordingly, there is a demand for a technology for increasing the defect detection accuracy.

SUMMARY OF THE INVENTION

This specification discloses a technology for increasing the detection accuracy of a defect in an insulator for a spark plug.

The technology disclosed in this specification can be realized in the following application examples.

APPLICATION EXAMPLE 1

A method for inspecting an insulator for a spark plug to determine whether or not the insulator has a defect, the spark plug extending in an axial direction, the method comprising:
a voltage applying step of applying a voltage between a first electrode disposed in an axial hole in the insulator and a second electrode disposed near an outer peripheral surface of the insulator,
wherein the voltage applying step is performed while a gap between a front end of the first electrode and an inner peripheral surface of the insulator that faces the front end of the first electrode is filled with a first insulating material without leaving a hollow space.

With this application example, the voltage applying step is performed while the gap between the front end of the first electrode and the inner peripheral surface that faces the front end of the first electrode in a radial direction is filled with the first insulating material without leaving a hollow space. Accordingly, the occurrence of the flashover can be suppressed in the voltage applying step. As a result, the voltage that can be applied in the voltage applying step can be increased, and therefore the defect detection accuracy can be increased. For example, even when the insulator has a relatively small defect, the defect can be detected.

APPLICATION EXAMPLE 2

The method according to Application Example 1, wherein the voltage applying step is performed while a back portion of the first electrode is covered with a second insulating material.

With this application example, the voltage applying step is performed while the back portion of the first electrode is covered with the second insulating material. As a result, in the voltage applying step, the occurrence of the flashover can be further suppressed. Therefore, the voltage that can be applied in the voltage applying step can be further increased, and the defect detection accuracy can be further increased.

APPLICATION EXAMPLE 3

The method according to Application Example 1 or 2, wherein the first insulating material is insulating liquid.

With this application example, the state in which the gap between the front end of the first electrode and the inner peripheral surface of the insulator is filled with an insulting material without leaving a hollow space can be easily established.

APPLICATION EXAMPLE 4

The method according to any one of Application Examples 1 to 3, wherein, in the voltage applying step, the front end of the first electrode is located in the axial hole.

With this application example, the length of the path from the front end of the first electrode to the second electrode can be increased, so that the occurrence of the flashover can be further suppressed.

APPLICATION EXAMPLE 5

The method according to Application Example 3, wherein the insulating liquid has a boiling point of 0 degrees Celsius or more and 100 degrees Celsius or less.

With this application example, the insulating liquid has an appropriate volatility, so that the step of drying the insulator after the inspection can be omitted. In addition, excessive variation in the liquid surface of the insulating liquid can be suppressed.

APPLICATION EXAMPLE 6

The method according to any one of Application Examples 2 to 5, wherein a front end of the second insulating material is on a front side of a position of a back end of a metal shell when the metal shell is attached to an outer periphery of the insulator.

With this application example, the occurrence of the flashover through the back-side opening in the insulator can be further suppressed.

The technology disclosed in this specification may be realized in various embodiments, such as an inspection device for a spark plug.

DESCRIPTION OF THE PREFERRED EMBODIMENTS

A. Embodiment
A-1. Structure of Spark Plug

Figure 1:
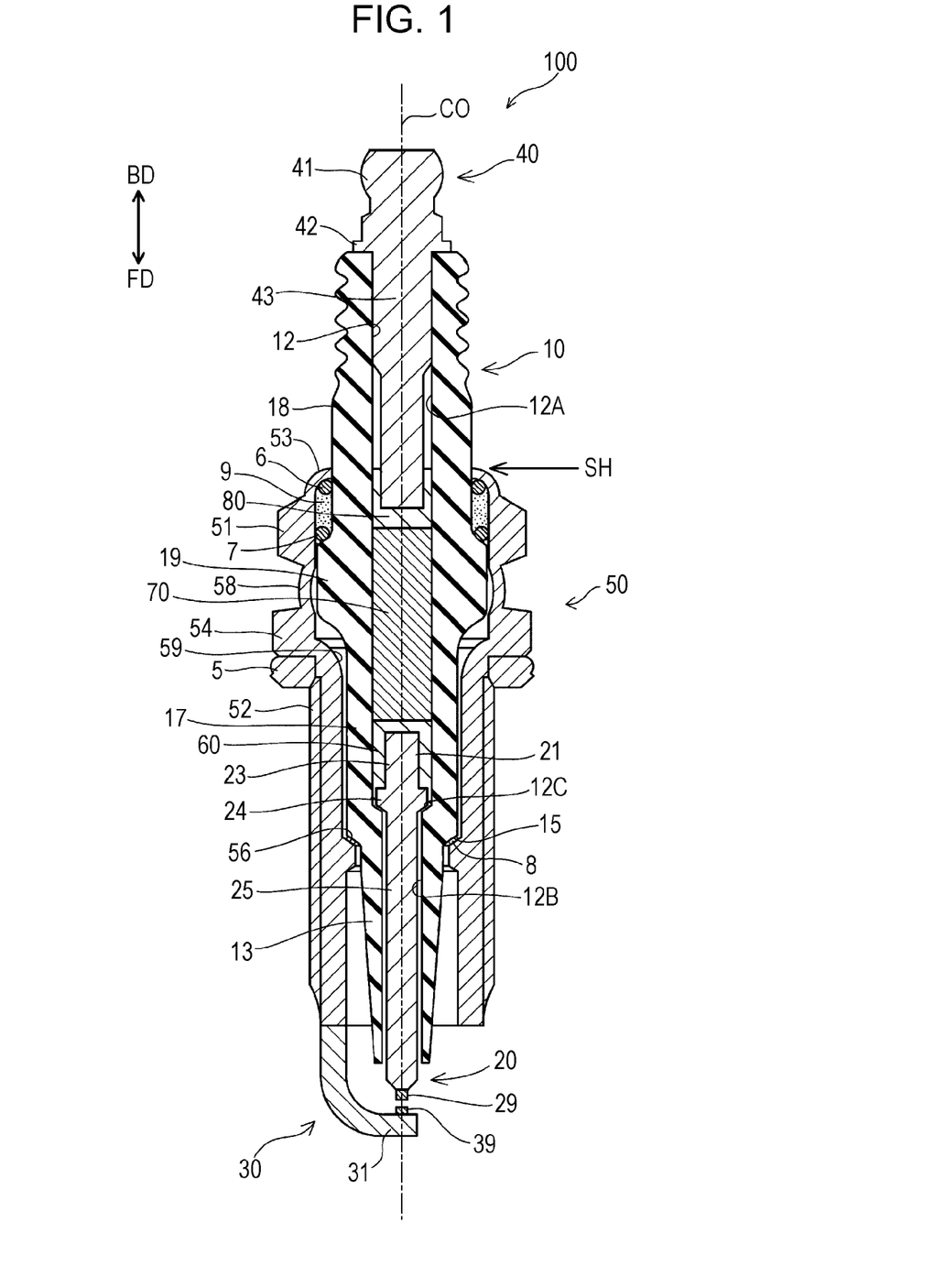
FIG. 1 is a sectional view of a spark plug according to an embodiment.

An embodiment of a technology disclosed in this specification will be described. FIG. 1 is a sectional view of a spark plug 100 according to the present embodiment. In FIG. 1, the one-dot chain line shows an axial line CO of the spark plug 100. The radial direction of a circle centered on the axial line CO is referred to simply as a "radial direction", and a circumferential direction of a circle centered on the axial line CO is referred to simply as a "circumferential direction". The downward direction in FIG. 1 is referred to as a forward direction FD, and the upward direction in FIG. 1 is referred to as a backward direction BD. The bottom side in FIG. 1 is referred to as the front side, and the top side in FIG. 1 is referred to as the back side. The spark plug 100 includes an insulator 10, a center electrode 20, a ground electrode 30, a terminal 40, and a metal shell 50.

The insulator 10 is formed by sintering alumina or the like. The insulator 10, which extends in the axial direction, is a substantially cylindrical member having an axial hole 12 that extends through the insulator 10. The insulator 10 includes a flange portion 19, a back-side body portion 18, a front-side body portion 17, a step portion 15, and a leg portion 13. The back-side body portion 18 is located on the back side of the flange portion 19, and has an outer diameter smaller than that of the flange portion 19. The front-side body portion 17 is located on the front side of the flange portion 19, and has an outer diameter smaller than that of the flange portion 19. The leg portion 13 is located on the front side of the front-side body portion 17, and has an outer diameter smaller than that of the front-side body portion 17. When the spark plug 100 is attached to an internal combustion engine (not shown), the leg portion 13 is exposed in a combustion chamber of the internal combustion engine. The step portion 15 is disposed between the leg portion 13 and the front-side body portion 17.

The axial hole 12 in the insulator 10 includes a first hole 12A at the back side, a second hole 12B located on the front side of the first hole 12A, and a narrowing hole 12C located between the first hole 12A and the second hole 12B. In other words, from the viewpoint of the axial hole 12, the insulator 10 includes a first portion in which the first hole 12A is formed, a second portion in which the second hole 12B is formed, and a step portion in which the narrowing hole 12C is formed. The diameter of the second hole 12B is smaller than that of the first hole 12A. The narrowing hole 12C has a diameter that decreases from the back side toward the front side.

The metal shell 50 is made of a conductive metal material (for example, a low-carbon steel material). The metal shell 50 is a cylindrical metal member used to fix the spark plug 100 to an engine head (not shown) of the internal combustion engine. The metal shell 50 has a through hole 59 that extends through the metal shell 50 along the axial line CO. The metal shell 50 is disposed around the outer periphery of the insulator 10. The insulator 10 is inserted and held in the through hole 59 in the metal shell 50. The front end of the insulator 10 projects from the front end of the metal shell 50 toward the front side. The back end of the insulator 10 projects from the back end of the metal shell 50 toward the back side.

The metal shell 50 includes a tool engagement portion 51 having a hexagonal columnar shape that engages with a spark plug wrench, a threaded portion 52 that is to be attached to the internal combustion engine, and a flange-shaped seating portion 54 provided between the tool engagement portion 51 and the threaded portion 52. The nominal diameter of the threaded portion 52 is, for example, M8 (8 mm (millimeter)), M10, M12, M14, or M18.

An annular gasket 5 formed by bending a metal plate is disposed between the threaded portion 52 and the seating portion 54 of the metal shell 50. The gasket 5 seals the gap between the spark plug 100 and the internal combustion engine (engine head) when the spark plug 100 is attached to the internal combustion engine.

The metal shell 50 further includes a thin-walled crimping portion 53 provided on the back side of the tool engagement portion 51 and a thin-walled compressive deformation portion 58 provided between the seating portion 54 and the tool engagement portion 51. Annular ring members 6 and 7 are disposed in an annular space between the inner peripheral surface of a portion of the metal shell 50 that extends from the tool engagement portion 51 to the crimping portion 53 and the outer peripheral surface of the back-side body portion 18 of the insulator 10. In this space, the region between the two ring members 6 and 7 is filled with powder of talc 9. The back end of the crimping portion 53 is bent radially inward and is fixed to the outer peripheral surface of the insulator 10. The compressive deformation portion 58 of the metal shell 50 is compressed when the crimping portion 53 fixed to the outer peripheral surface of the insulator 10 is pressed toward the front side in the manufacturing process. Owing to the compressive deformation of the compressive deformation portion 58, the insulator 10 is pressed toward the front side by the ring members 6 and 7 and the talc 9 in the metal shell 50. Accordingly, the step portion 15 of the insulator 10 (insulator step portion) is pressed against a step portion 56 formed on the inner periphery of the threaded portion 52 of the metal shell 50 (metal shell step portion) with an annular plate-shaped packing 8 made of a metal disposed therebetween. The plate-shaped packing 8 prevents the gas in the combustion chamber of the internal combustion engine from leaking out through the gap between the metal shell 50 and the insulator 10.

In FIG. 1, SH denotes the position of the back end of the metal shell 50 (that is, the back end of the crimping portion 53) in the axial direction.

The center electrode 20 includes a rod-shaped center electrode body 21 that extends in the axial direction and a columnar center electrode tip 29 bonded to the front end of the center electrode body 21. The center electrode body 21 is disposed in a front region of the axial hole 12 in the insulator 10. The center electrode body 21 is made of, for example, nickel or an alloy containing nickel as the main component. The center electrode body 21 includes a flange portion 24 provided at a predetermined position in the axial direction, a head portion 23 disposed on the back side of the flange portion 24, and a leg portion 25 disposed on the front side of the flange portion 24. The flange portion 24 is supported by a step portion of the insulator 10 that defines the narrowing hole 12C. The front end of the leg portion 25, that is, the front end of the center electrode body 21, projects from the front end of the insulator 10 toward the front side. The center electrode tip 29 is made of, for example, a high-melting-point noble metal material, and is bonded to the front end of the center electrode body 21.

The ground electrode 30 includes a ground electrode body 31 bonded to the front end of the metal shell 50 and a columnar ground electrode tip 39. The back end of the ground electrode body 31 is bonded to the front end surface of the metal shell 50. The ground electrode body 31 is made of a metal having a high corrosion resistance, such as a nickel alloy. The ground electrode tip 39 is made of a high-melting-point noble metal material, and is bonded to a surface of a front end portion of the ground electrode body 31 that faces the center electrode 20.

The back end surface of the ground electrode tip 39 and the front end surface of the center electrode tip 29 form a gap in which spark discharge occurs. The region around the gap is referred to also as a firing end of the spark plug 100.

The terminal 40 is a rod-shaped member that extends in the axial direction. The terminal 40 is made of, for example, a conductive metal material (for example, a low-carbon steel material). The terminal 40 includes a flange portion 42 (terminal jaw portion), a cap attachment portion 41 located on the back side of the flange portion 42, and a leg portion 43 (terminal leg portion) located on the front side of the flange portion 42. The leg portion 43 of the terminal 40 is inserted into the axial hole 12 (first hole 12A) in the insulator 10. The cap attachment portion 41 projects from the insulator 10 toward the back side.

A resistor 70 is disposed between the front end of the terminal 40 and the back end of the center electrode 20 in the axial hole 12 in the insulator 10. The resistor 70 is provided to reduce noise when a spark is generated. The space between the resistor 70 and the center electrode 20 in the axial hole 12 is filled with a conductive seal 60. The space between the resistor 70 and the leg portion 43 of the terminal 40 is filled with a conductive seal 80.

The spark plug 100 is attached to an internal combustion engine of, for example, an automobile. More specifically, a direct current voltage of about 20 kV is applied between the terminal 40 and the metal shell 50 so that a spark discharge occurs in the gap between the center electrode 20 and the ground electrode 30. Fuel gas is ignited in the internal combustion engine by the energy of the spark discharge.

A-2. Inspection of Insulator 10

Figure 2:
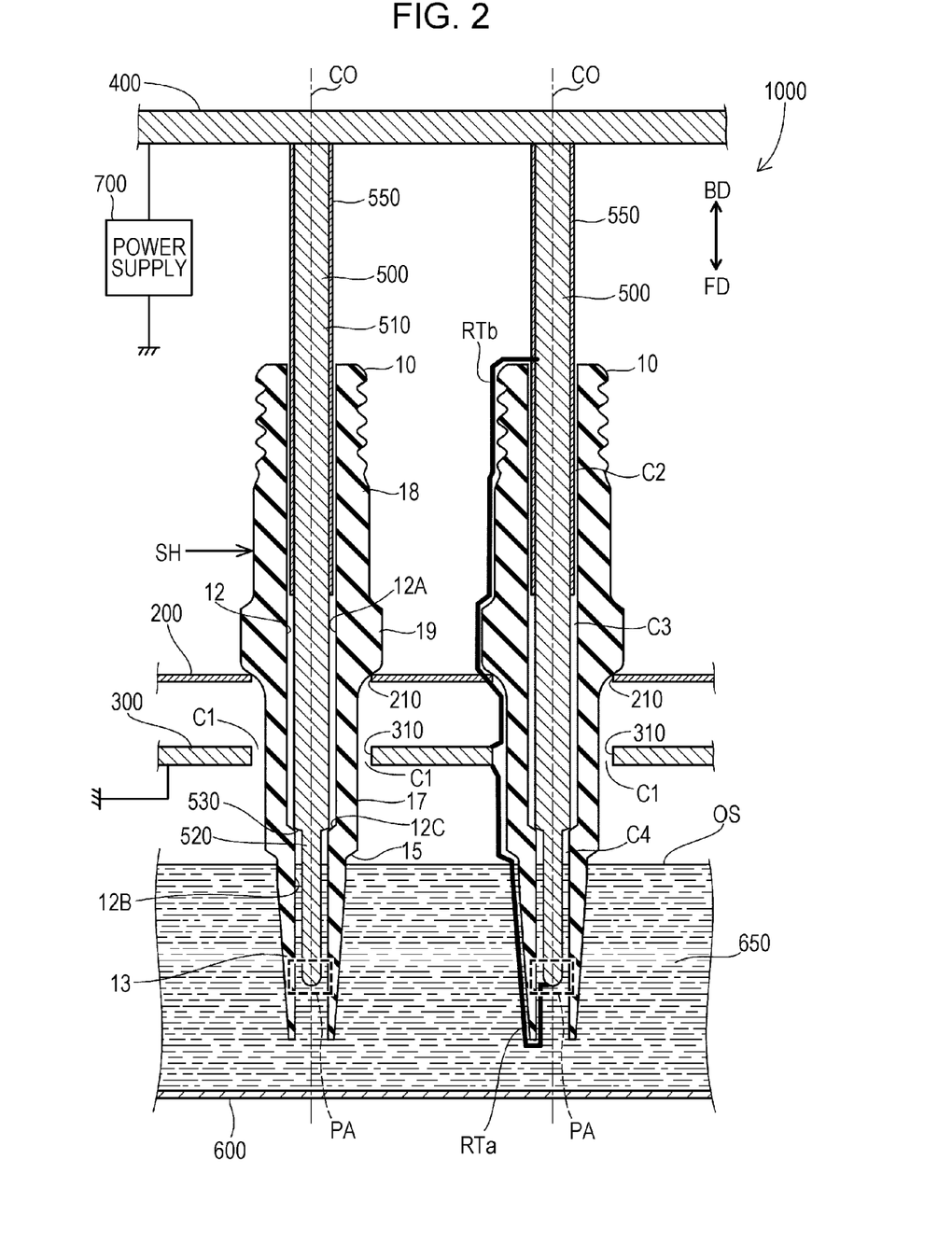
FIG. 2 is a schematic diagram illustrating an inspection device.

A method for inspecting the insulator 10 included in the above-described spark plug 100 will now be described. FIG. 2 is a schematic diagram illustrating an inspection device 1000 with which the method for inspecting the insulator 10 is carried out.

The inspection device 1000 is capable of simultaneously inspecting N insulators 10, where N is a natural number (16 in the present embodiment). FIG. 2 illustrates a portion of the inspection device 1000 for inspecting two insulators 10.

The direction of the axial lines CO of the insulators 10 is defined as the axial direction of the spark plug 100. The forward direction FD of the insulators 10 is defined as the forward direction FD of the inspection device 1000, and the backward direction BD of the insulators 10 is defined as the backward direction BD of the inspection device 1000.

The inspection device 1000 includes an insulator support 200, a plate-shaped electrode 300, an electrode support 400, N rod-shaped electrodes 500, an oil tank 600, and a power supply 700. In the present embodiment, the inspection device 1000 is operated at atmospheric pressure. FIGS. 3A, 3B, 4A, and 4B are diagrams illustrating the components 200 to 600 of the inspection device 1000 viewed in the forward direction FD from the back side in FIG. 2.

Figure 3A:
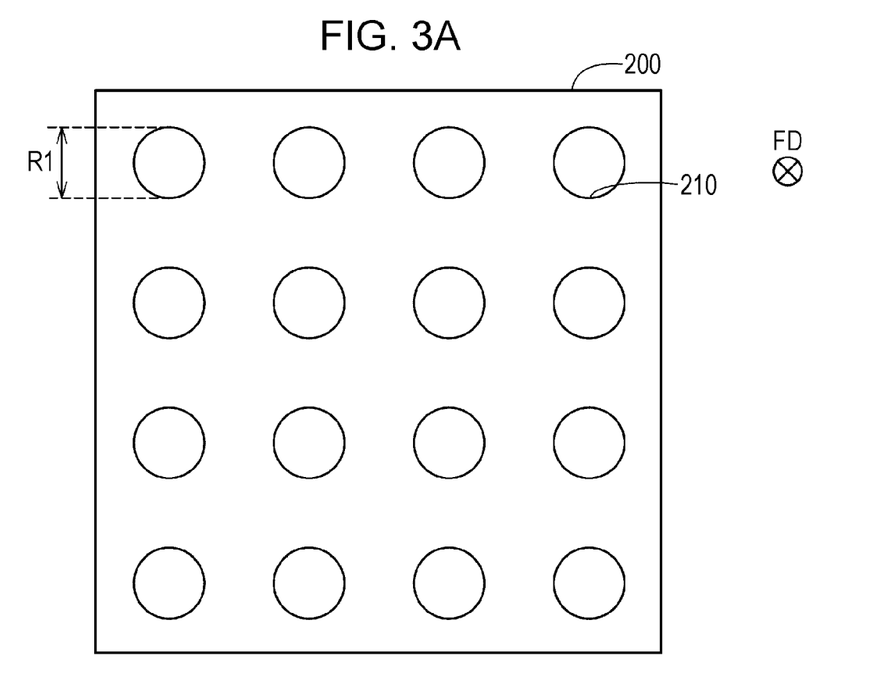
FIG. 3A is a diagram illustrating an insulator support viewed in a direction from a back side toward a front side.

FIG. 3A illustrates the insulator support 200. The insulator support 200 is, for example, a plate-shaped member having a rectangular shape when viewed in the forward direction FD from the back side. The insulator support 200 is made of, for example, an insulating resin material such as polypropylene. The insulator support 200 includes N securing holes 210 used to secure the N insulators 10 that are to be inspected. In the example illustrated in FIG. 3A, the N securing holes 210 are arranged in matrix when the insulator support 200 is viewed in the forward direction FD from the back side. The hole diameter R1 of each securing hole 210 is greater than the outer diameter of the front-side body portion 17 of each insulator 10, and is smaller than the outer diameter of the flange portion 19 of the insulator 10. Accordingly, as described below, the insulators 10 can be secured in the securing holes 210 during the inspection.

Figure 3B:
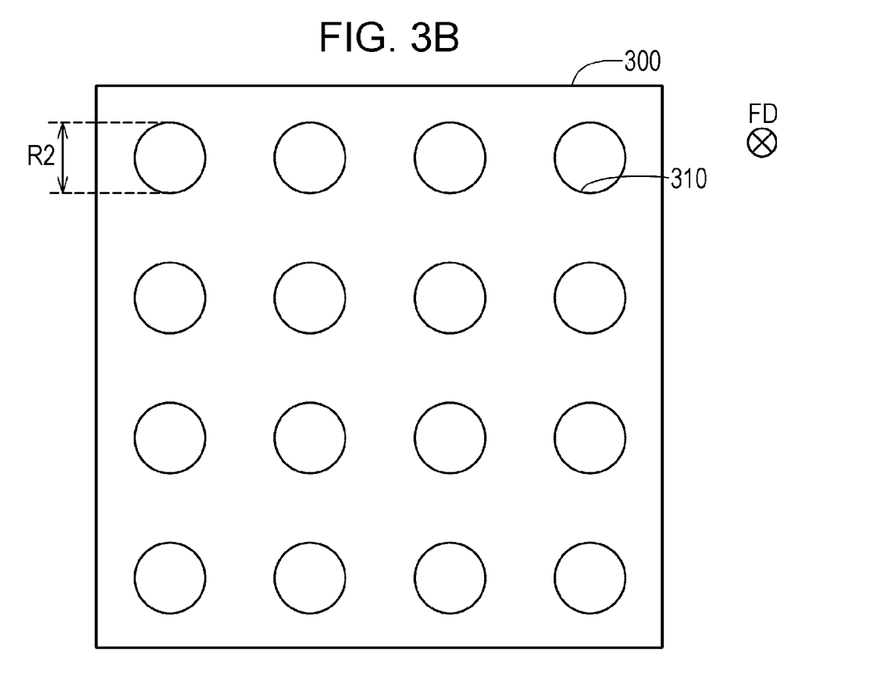
FIG. 3B is a diagram illustrating a plate-shaped electrode viewed in the direction from the back side toward the front side.

FIG. 3B illustrates the plate-shaped electrode 300. Similar to the insulator support 200, the plate-shaped electrode 300 is, for example, a plate-shaped member having a rectangular shape when viewed in the forward direction FD from the back side. The plate-shaped electrode 300 is made of a conductive material, for example, a metal such as iron or copper or an alloy containing these metals. The plate-shaped electrode 300 includes N electrode holes 310 at positions corresponding to the N securing holes 210 formed in the insulator support 200. When the plate-shaped electrode 300 and the insulator support 200 are stacked together at appropriate positions, the axial lines of the N electrode holes 310 coincide with the axial lines of the N securing holes 210. The hole diameter R2 of each electrode hole 310 is slightly larger than the outer diameter of the front-side body portion 17 of each insulator 10. Accordingly, as described below, the plate-shaped electrode 300 may be disposed near the outer peripheral surface of the front-side body portion 17 of each of the insulators 10 that are to be inspected during the inspection. As illustrated in FIG. 2, the plate-shaped electrode 300 is grounded.

Figure 4A:
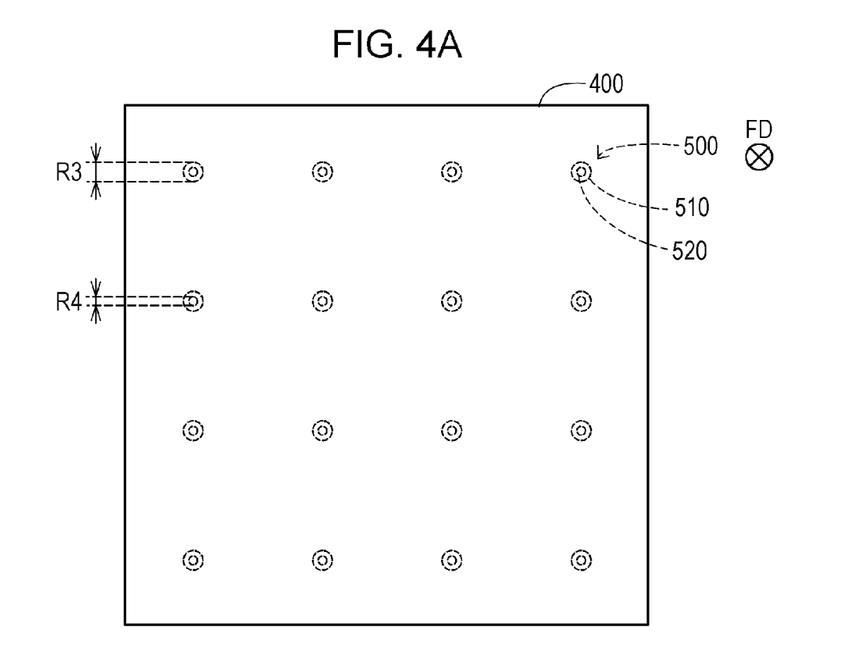
FIG. 4A is a diagram illustrating an electrode support and rod-shaped electrodes viewed in the direction from the back side toward the front side.

FIG. 4A illustrates the electrode support 400 and the N rod-shaped electrodes 500. Similar to the insulator support 200 and the plate-shaped electrode 300, the electrode support 400 is, for example, a plate-shaped member having a rectangular shape when viewed in the forward direction FD from the back side. Similar to the plate-shaped electrode 300, the electrode support 400 is made of a conductive material such as a metal or an alloy. The back ends of the N rod-shaped electrodes 500 are fixed to the electrode support 400 at positions corresponding to the N securing holes 210 formed in the insulator support 200 (FIGS. 2 and 4A). Accordingly, as described below, the rod-shaped electrodes 500 may be disposed in the axial holes 12 in the insulators 10 to be inspected during the inspection.

As illustrated in FIG. 2, the N rod-shaped electrodes 500 are rod-shaped members that extend in the axial direction.

Similar to the plate-shaped electrode 300 and the electrode support 400, each rod-shaped electrode 500 is made of a conductive material such as a metal or an alloy. Each rod-shaped electrode 500 includes a large-diameter portion 510 at the back side, a small-diameter portion 520 at the front side, and a thinning portion 530 disposed between the large-diameter portion 510 and the small-diameter portion 520. The outer diameter R3 of the large-diameter portion 510 is smaller than that hole diameter of the first hole 12A in each insulator 10, and is larger than the hole diameter of the second hole 12B in each insulator 10. The outer diameter R4 of the small-diameter portion 520 is smaller than the hole diameter of the second hole 12B in each insulator 10. The outer diameter of the thinning portion 530 decreases from R3 to R4 along the forward direction FD from the back side. A back portion of the rod-shaped electrode 500 (more specifically, a back portion of the large-diameter portion 510) is covered with an insulating member 550. The insulating member 550 is formed of an insulating resin material, such as polytetrafluoroethylene or silicone rubber.

The power supply 700 (see FIG. 2) is connected to the conductive electrode support 400, and is capable of applying a specific voltage, which will be described below, to each rod-shaped electrode 500 through the electrode support 400.

Figure 4B:
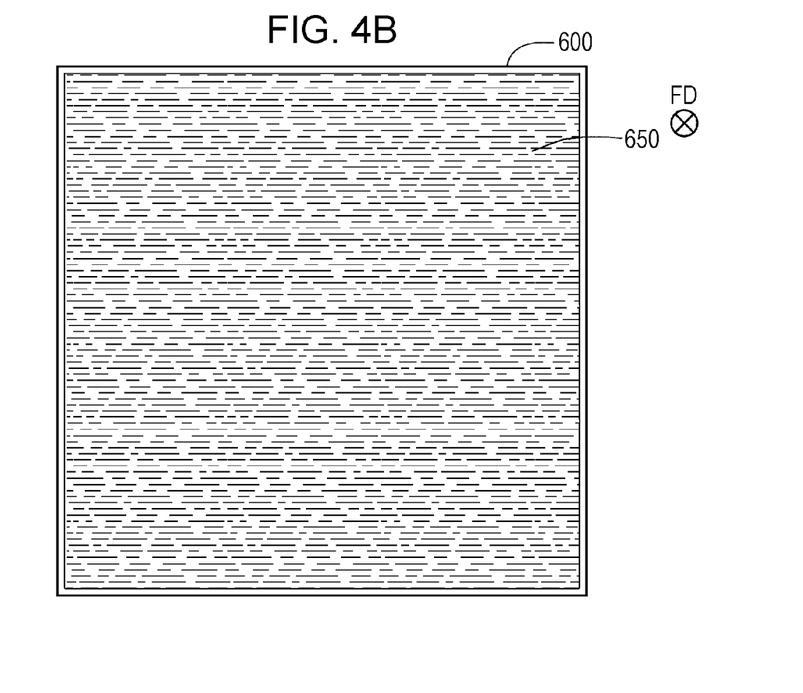
FIG. 4B is a diagram illustrating an oil tank viewed in the direction from the back side toward the front side.

FIG. 4B illustrates the oil tank 600. When viewed in the forward direction FD from the back side, the oil tank 600 has a rectangular shape having substantially the same size as the size of the insulator support 200. The oil tank 600 contains insulating oil 650. Fluorine-based inactive oil, for example, is used as the insulating oil. In the present embodiment, Fluorinert (registered trademark) FC-770 manufactured by 3M (registered trademark) having a boiling point of 95 degrees Celsius and a dielectric strength of 40 kV may be used.

Figure 5:
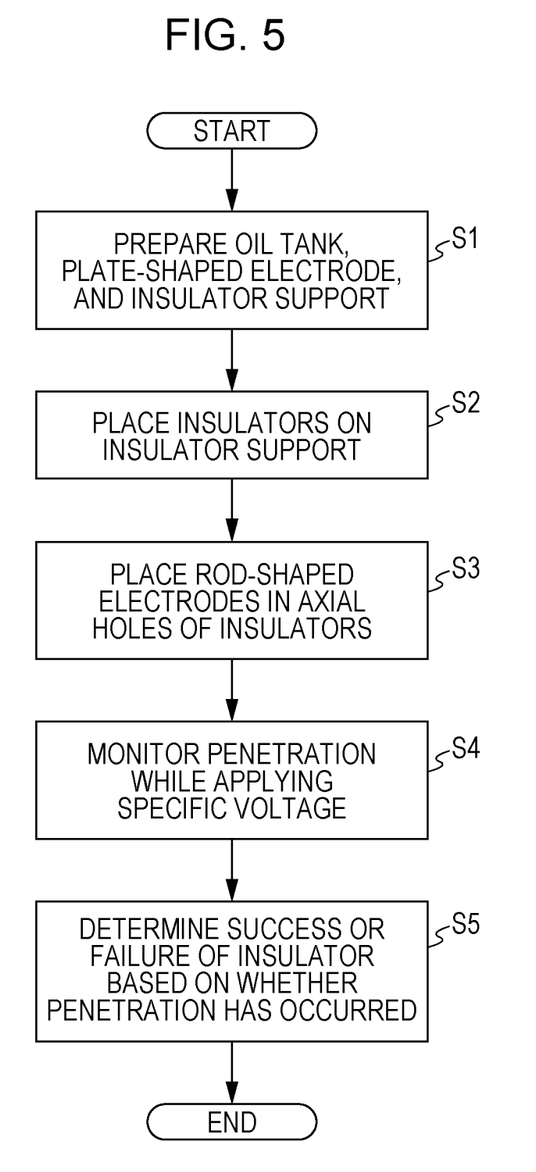
FIG. 5 is a flowchart of a method for inspecting insulators.

The steps of the method for inspecting the insulators 10 with the inspection device 1000 will now be described. FIG. 5 is a flowchart of the method for inspecting the insulators 10. In step S1, the oil tank 600 filled with the oil 650, the plate-shaped electrode 300 disposed above the oil tank 600, that is, on the backward-direction-BD side of the oil tank 600 in FIG. 2, and the insulator support 200 disposed above the plate-shaped electrode 300 are prepared. The plate-shaped electrode 300 and the insulator support 200 are secured with a fixing part (not shown) such that they are parallel to a liquid surface OS of the oil 650 in the oil tank 600 and such that a predetermined gap is provided therebetween.

In step S2, the N insulators 10 to be inspected are arranged on the insulator support 200. More specifically, as illustrated in FIG. 2, a worker places the N insulators 10 on the insulator support 200 by inserting the insulators 10 through the N securing holes 210 in the insulator support 200 one at a time from the backward-direction-BD side. Accordingly, the front end of each insulator 10 is inserted through the corresponding electrode hole 310 in the plate-shaped electrode 300 and immersed in the oil 650 in the oil tank 600.

More specifically, an edge portion of each electrode hole 310 in the plate-shaped electrode 300 surrounds the outer peripheral surface of the front-side body portion 17 of the corresponding insulator 10 over the entire circumference thereof. A predetermined clearance C1 (for example, 1 mm) is provided between the edge portion of each electrode hole 310 and the outer peripheral surface of the front-side body portion 17 of the corresponding insulator 10. Substantially the entirety of the leg portion 13 of each insulators 10 is immersed in the oil 650.

In step S3, each rod-shaped electrode 500 is placed in the axial hole 12 in the corresponding one of the N insulators 10. More specifically, the electrode support 400 to which the N rod-shaped electrodes 500 are fixed is attached to a sliding mechanism (not shown). The sliding mechanism causes the electrode support 400 to slide from the backward-direction-BD side toward the forward-direction-FD side so that the rod-shaped electrodes 500 are inserted into the axial holes 12 in the N insulators 10 from the back side. As illustrated in FIG. 2, each rod-shaped electrode 500 is secured at a position where the thinning portion 530 of the rod-shaped electrode 500 is in contact with the step portion of the insulator 10 that defines the narrowing hole 12C.

As a result, the small-diameter portion 520 of each rod-shaped electrode 500 is disposed in the second hole 12B in the corresponding insulator 10, and a front portion of the large-diameter portion 510 of each rod-shaped electrode 500 is disposed in the first hole 12A in the corresponding insulator 10. The front portion of each rod-shaped electrode 500 (front portion of the small-diameter portion 520) is immersed in the oil 650 in the oil tank 600. In this state, as shown in regions PA surrounded by the broken lines in FIG. 2, the gap between the front end of each rod-shaped electrode 500 and the inner peripheral surface of the corresponding insulator 10 that faces the front end of the rod-shaped electrode 500 in the radial direction is filled with the oil 650 without leaving a hollow space.

In this state, the front end of each rod-shaped electrode 500 is on the back side of the front end of the corresponding insulator 10. In other words, the front end of each rod-shaped electrode 500 does not project from the axial hole 12 in the corresponding insulator 10 in the forward direction FD.

In addition, in this state, a front portion of the portion of each rod-shaped electrode 500 (portion of the large-diameter portion 510) covered with the insulating member 550 is disposed in the axial hole 12 (first hole 12A) in the corresponding insulator 10, and a back portion of the portion covered with the insulating member 550 projects from the back end of the insulator 10 toward the back side. The front end of the insulating member 550 is on the front side of the position SH in the axial direction described with reference to FIG. 1, that is, the position SH of the back end of the metal shell 50 when the metal shell 50 is attached to the outer periphery of the insulator 10.

In this state, a predetermined clearance C2 is provided between the outer peripheral surface of the insulating member 550 that covers the rod-shaped electrode 500 and the inner peripheral surface of the insulator 10 that defines the first hole 12A. Similarly, a predetermined clearance C3 is provided between the outer peripheral surface of the large-diameter portion 510 of the rod-shaped electrode 500 and the inner peripheral surface of the insulator 10 that defines the first hole 12A, and a predetermined clearance C4 is provided between the small-diameter portion 520 and the inner peripheral surface of the insulator 10 that defines the second hole 12B.

In step S4, the power supply 700 applies a specific voltage between the plate-shaped electrode 300 and each rod-shaped electrode 500 for a specific time period while monitoring the occurrence of penetration through each insulator 10.

The specific voltage is, for example, a voltage higher than the voltage at which flashover occurs in normal operation. The voltage at which the flashover occurs in normal operation is a voltage at which the flashover occurs when the front end of each insulator 10 and the front end of each rod-shaped electrode 500 are not immersed in the oil 650 and when the back portion of the rod-shaped electrode 500 is not covered with the insulating member 550. The flashover is a phenomenon in which a spark discharge occurs along a path that extends along the surfaces (inner and outer peripheral surfaces) of the insulator without allowing a current to penetrate the insulator. In the present embodiment, the voltage at which the flashover occurs in normal operation is an alternating current voltage of 18 kV. The specific voltage applied in step S4 in the present embodiment is, for example, an alternating current voltage of 20 kV. The specific time period for which the specific voltage is applied is, for example, 30 seconds.

While the specific voltage is being applied, a worker visually checks the occurrence of penetration through each insulator 10. The penetration is a phenomenon in which a breakdown occurs in a portion of the insulator 10. When a penetration through the insulator 10 occurs, a spark is generated between the penetrated portion and the plate-shaped electrode 300. Therefore, the worker can visually check the occurrence of the penetration. When the insulator 10 has a defect, such as a pinhole, which significantly reduces the voltage resistivity, the defect serves as a penetration starting point and a penetration through the portion including the defect occurs. When the insulator 10 does not have a defect, the penetration does not occur. Therefore, whether or not the insulator 10 has a defect can be determined by detecting the occurrence of the penetration.

In step S5, whether the N insulators 10 have passed or failed the inspection is determined on the basis of whether or not the penetration has occurred. The insulators 10 in which the penetration has occurred are determined as having failed the inspection, and the insulators 10 in which the penetration has not occurred are determined as having passed the inspection.

According to the above-described embodiment, a voltage applying step of applying a voltage between each rod-shaped electrode 500 (referred to also as a first electrode) disposed in the axial hole 12 in the corresponding insulator 10 and the plate-shaped electrode 300 (referred to also as a second electrode) disposed near the outer peripheral surface of the insulator 10 is performed (step S4 in FIG. 5). This step is performed while the back portion of the rod-shaped electrode 500 is covered with the insulating member 550 (referred to also as a second insulating material) and the gap between the front end of the rod-shaped electrode 500 and the inner peripheral surface of the insulator 10 that faces the front end of the rod-shaped electrode 500 is filled with the insulating oil 650 (referred to also as a first insulating material) without leaving a hollow space.

As a result, the occurrence of the flashover can be suppressed in the voltage applying step. More specifically, since the insulating oil 650 is provided at an intermediate position of a front-side path RTa along which the flashover occurs, that is, the path RTa that extends from the front end of the rod-shaped electrode 500 to the plate-shaped electrode 300 through the front-side opening of the axial hole 12 in the insulator 10, the occurrence of the flashover along the path RTa is suppressed. In the case where the insulating member 550 is not provided, a back-side path along which the flashover occurs, that is, a path that extends from the rod-shaped electrode 500 to the plate-shaped electrode 300 through the back-side opening of the axial hole 12 in the insulator 10, is a path RTb illustrated in FIG. 2. However, since the insulating member 550 is provided, the length of the path is increased by the distance from the back end of the insulator 10 to the front end of the insulating member 550 in the axial direction. Since the length of the back-side path along which the flashover occurs is increased, the occurrence of the flashover along the back-side path is suppressed.

Accordingly, the specific voltage that can be applied in the voltage applying step can be increased from that in the case where the insulating materials such as the insulating member 550 and the oil 650 are not provided. For example, when the flashover occurs, a current flows between the rod-shaped electrode 500 and the plate-shaped electrode 300 irrespective of the occurrence of the penetration through the insulator 10. Therefore, a voltage higher than the voltage at which the flashover occurs cannot be applied. As described above, according to the present embodiment, the flashover does not occur even when a voltage (for example, 20 kV) higher than the voltage at which the flashover occurs in normal operation (for example, 18 kV) is applied.

As a result, the penetration occurs at a portion including a smaller defect, and the defect detection accuracy can be increased accordingly. In other words, even when the insulator 10 has a relatively small defect, the defect can be detected.

The electric energy easily concentrates at the front end of the insulator 10. Therefore, if a relatively high voltage is applied, the penetration may occur even when there is no defect. However, when the front end of the insulator 10 is immersed in the oil 650, the concentration of the electric energy at the front end of the insulator 10 can be suppressed. As a result, false detection of a defect can be suppressed.

The insulating material disposed at the front side of the rod-shaped electrode 500 is insulating liquid (more specifically, the oil 650). Accordingly, the state in which the gap between the front end of the rod-shaped electrode 500 and the inner peripheral surface of the insulator 10 that faces the front end of the rod-shaped electrode 500 in the radial direction without leaving a hollow space can be easily established.

The front end of the rod-shaped electrode 500 is located in the axial hole 12 in the insulator 10. Therefore, the length of the above-described path RTa is larger than that in the case where the front end of the rod-shaped electrode 500 projects from the axial hole 12 in the insulator 10 in the forward direction FD. As a result, the occurrence of the flashover can be further suppressed.

When, for example, the boiling point of the oil 650 is excessively low, the oil 650 has an excessively high volatility. In such a case, the liquid surface OS of the oil 650 varies as the oil 650 volatilizes, and it may become difficult to perform an appropriate inspection. In addition, when the boiling point of the oil is excessively high, the oil 650 has an excessively low volatility. In such a case, a drying step of drying the insulator 10 may be necessary after the inspection. In the above-described embodiment, oil having a boiling point in the range of 0 degrees Celsius or more and 100 degrees Celsius or less is used as the insulating oil 650. More specifically, fluorine-based inactive oil having a boiling point of 95 degrees Celsius is used. In this case, the oil 650 has an appropriate volatility, so that the drying step of drying the insulator after the inspection may be omitted, and the excessive variation of the liquid surface OS of the oil 650 can be suppressed. From the viewpoint of volatility, the insulating oil 650 preferably has a boiling point in the range of 30 degrees Celsius or more and 100 degrees Celsius or less, and more preferably, in the range of 50 degrees Celsius or more and 100 degrees Celsius or less.

When the voltage applying step is performed, the front end of the insulating member 550 is on the front side of the position SH (see FIGS. 1 and 2) of the back end of the metal shell 50 when the metal shell 50 is attached to the outer periphery of the insulator 10. Accordingly, the length of the path along which the flashover occurs and that passes through the back-side opening of the insulator 10 can be increased. Therefore, the occurrence of the flashover can be further suppressed.

B. Modifications (1) According to the inspection method of the above-described embodiment, the voltage applying step (step S4 in FIG. 5) is performed while the back portion of the rod-shaped electrode 500 is covered with the insulating member 550 (referred to also as the second insulating material) and the gap between the front end of the rod-shaped electrode 500 and the inner peripheral surface of the insulator 10 that faces the front end of the rod-shaped electrode 500 is filled with the insulating oil 650 (referred to also as the first insulating material) without leaving a hollow space. However, the insulating member 550 may be omitted. In other words, the voltage applying step (step S4 in FIG. 5) may be performed while the gap between the front end of the rod-shaped electrode 500 and the inner peripheral surface of the insulator 10 that faces the front end of the rod-shaped electrode 500 is filled with the insulating oil 650 without leaving a hollow space but the back portion of the rod-shaped electrode 500 is not covered with the insulating member 550. Even in this case, the insulating oil 650 is provided at an intermediate position of the front-side path RTa along which the flashover easily occurs, that is, the path RTa that extends from the front end of the rod-shaped electrode 500 to the plate-shaped electrode 300 through the front-side opening of the axial hole 12 in the insulator 10. Therefore, the occurrence of the flashover along the path RTa can be suppressed. As a result, the defect detection accuracy can be increased.

(2) In the inspection method of the above-described embodiment, the insulating oil 650 is used as an insulating material disposed at the front side of the insulator 10 and the rod-shaped electrode 500. However, an insulating material in the form of a gel or solid may instead be used. Any type of insulating material may be used as long as the voltage applying step is performed while the gap between the front end of the rod-shaped electrode 500 and the inner peripheral surface of the insulator 10 that faces the front end of the rod-shaped electrode 500 in the radial direction is filled with the insulating material without leaving a hollow space.

(3) The position of the insulating member 550 that covers the back portion of the rod-shaped electrode 500 is not limited to that in the above-described embodiment. For example, the front end of the insulating member 550 may be located on the back side of the position SH of the back end of the metal shell 50 to be attached. The insulating member 550 that covers the back portion of the rod-shaped electrode 500 preferably covers at least a portion of the back portion of the rod-shaped electrode 500, that is, a portion of the rod-shaped electrode 500 at the position of the back end of the insulator 10 in the axial direction in the voltage applying step.

(4) In the inspection method of the above-described embodiment, the voltage applying step is performed at atmospheric pressure. However, the voltage applying step may instead be performed at a pressure higher than atmospheric pressure.

Although the present invention has been described based on the embodiment and modifications, the above-described embodiment of the present invention is intended to facilitate understanding of the present invention, and does not limit the present invention. The present invention allows modifications and improvements without departing from the spirit of the present invention and the scope of the claims, and includes equivalents thereof.

What is claimed is:

1. A method for inspecting an insulator for a spark plug to determine whether or not the insulator has a defect, the spark plug extending in an axial direction, the method comprising:
a voltage applying step of applying a voltage between a first electrode disposed in an axial hole in the insulator and a second electrode disposed near an outer peripheral surface of the insulator,
wherein the voltage applying step is performed while a gap between a front end of the first electrode and an inner peripheral surface of the insulator that faces the front end of the first electrode is filled with a first insulating material without leaving a hollow space; and
wherein, in the voltage applying step, a front distal tip of the first electrode is located in the axial hole.

2. The method according to claim 1, wherein the voltage applying step is performed while a back portion of the first electrode is covered with a second insulating material.

3. The method according to claim 2, wherein a front end of the second insulating material is on a front side of a position of a back end of a metal shell when the metal shell is attached to an outer periphery of the insulator.

4. The method according to claim 1, wherein the first insulating material is insulating liquid.

5. The method according to claim 4, wherein the insulating liquid has a boiling point of 0 degrees Celsius or more and 100 degrees Celsius or less.

\* \* \* \* \*